United States Patent [19]
Liu et al.

[11] Patent Number: 5,814,854
[45] Date of Patent: Sep. 29, 1998

[54] HIGHLY SCALABLE FLASH EEPROM CELL

[76] Inventors: David K. Y. Liu, 19970 Brenda Ct., Cupertino, Calif. 95014; Wenchi Ting, 4837 Lago Vista Cir., San Jose, Calif. 95129

[21] Appl. No.: 711,479

[22] Filed: Sep. 9, 1996

[51] Int. Cl.⁶ .................... H01L 29/788; H01L 29/792
[52] U.S. Cl. .................... 257/315; 257/322; 257/326
[58] Field of Search .................... 257/315, 322, 257/326

[56] References Cited

U.S. PATENT DOCUMENTS

4,258,378  3/1981  Wall .
4,302,766  11/1981  Guterman et al. .
4,423,371  12/1983  Senturia et al. .

*Primary Examiner*—Stephen Meier
*Attorney, Agent, or Firm*—Sawyer & Associates

[57] ABSTRACT

The present invention is directed toward a novel type of FLASH EEPROM cell that is highly scalable in size, easy to fabricate, reliable and capable of in-system programmability. The semiconductor memory cell comprises a lightly doped n- region including a channel region, a first insulating layer overlying portions of said n- region, and a floating gate overlying said first insulating layer. The cell further includes a second insulating layer overlying said floating gate and a control gate overlying second insulating layer.

15 Claims, 10 Drawing Sheets

HIGHLY SCALABLE FLASH EEPROM CELL

FIELD OF THE INVENTION

The present invention relates to a new integrated circuit memory device, more specifically, the present invention relates to cell structures and methods to place charge on, remove charge from, and detect the charge state on the floating gate of such memory cells.

BACKGROUND OF THE INVENTION

High-density FLASH memory devices are used as non-volatile embedded memory or mass-storage devices. For either application, minimizing cell size while maintaining process simplicity is a top priority since every memory chip contains a large number (several million, for example) of cells in arrays which occupy most of the die. A smaller cell translates into a smaller die size and consequently lower manufacturing costs for each die. This is crucial if FLASH memory is to replace magnetic disk drive in mass storage applications.

Figure 1A:
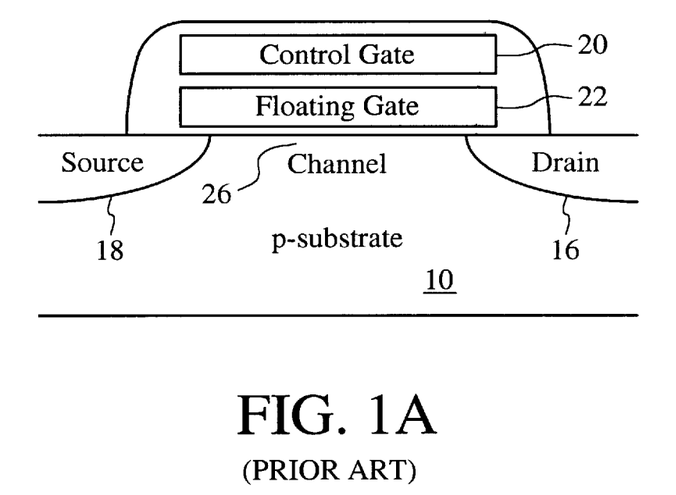
Figure 1B:
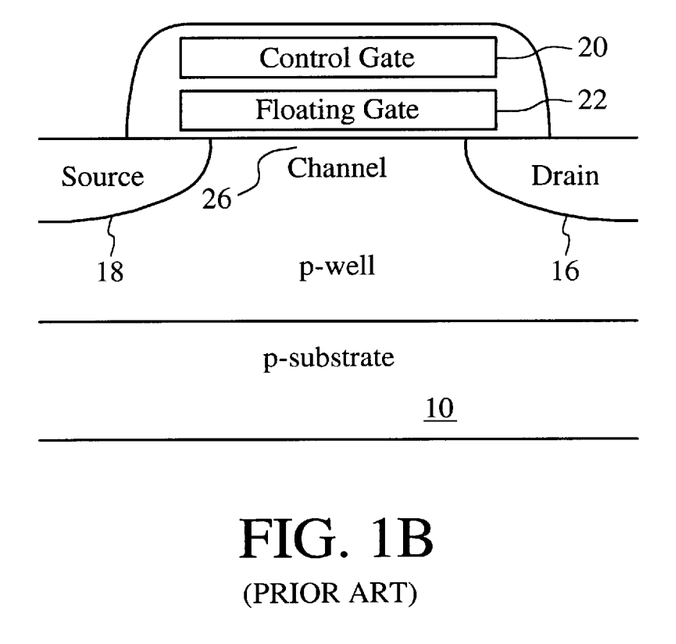
Figure 1C:
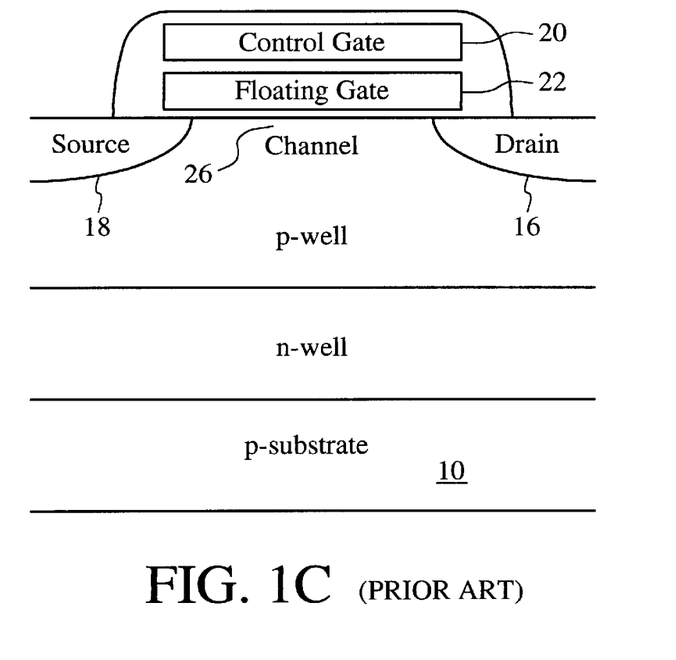

The two popular architectures for high-density FLASH memory are the NAND, which utilizes Fowler-Nordheim FN tunneling for both write and erase, and the NOR, which uses channel hot-electron programming and FN tunneling erasure. These two methods both adopt a stacked-gate transistor cell. The cell may be placed directly inside the p-substrate, or inside a p-well which is contained by the p-substrate, or inside a p-well contained by an n-well then contained by the p-substrate. The exact configuration is determined by the program and erase techniques. Cross-sectional schematics of such cells are shown in FIG. 1 (A), (B), and (C), respectively. The cell is also known as ETOX in prior art.

Figure 2A:
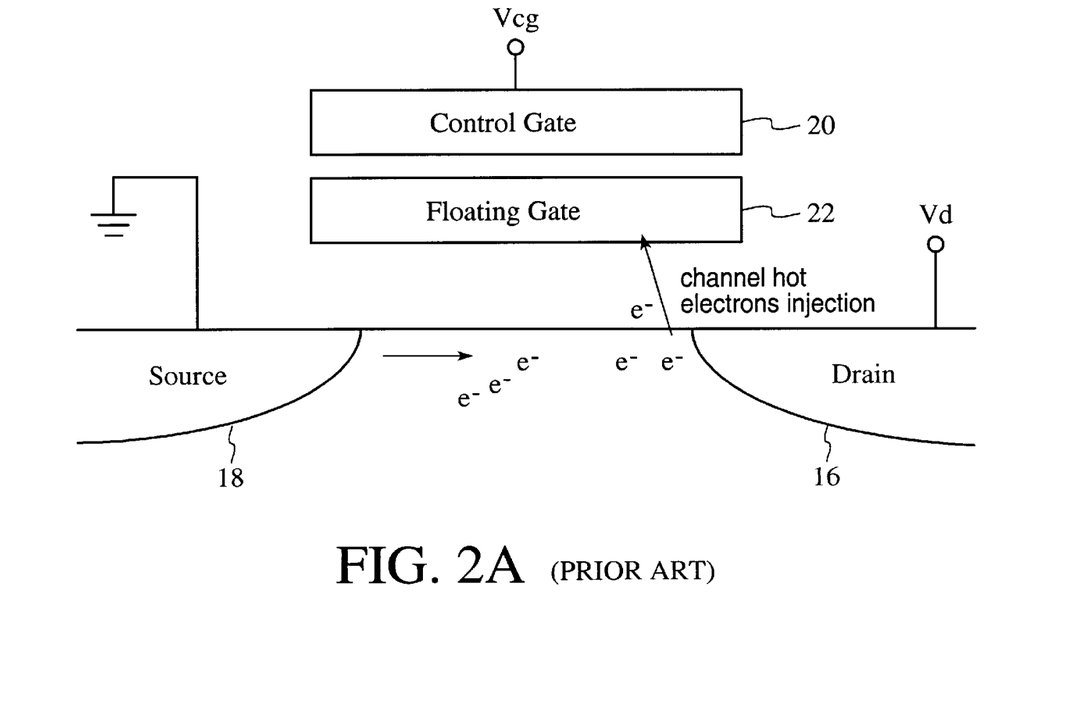

When channel hot electron injection is used to place electrons onto the floating gate 22, a high voltage (typically 10 to 12 V) is applied to the control gate 20. The drain 16 is biased at typically 5 to 7 V. This is illustrated in FIG. 2 (A). Electrons that flow from the source 18 to drain 16 are accelerated by the high electric field in the depletion region near the drain junction. Some of these electrons gain enough energy to overcome the energy barrier between the gate oxide and the channel 26, and enter the floating gate 22. This process is also assisted by the vertical electric field that favors electron injection into the floating gate 22.

Figure 2B:
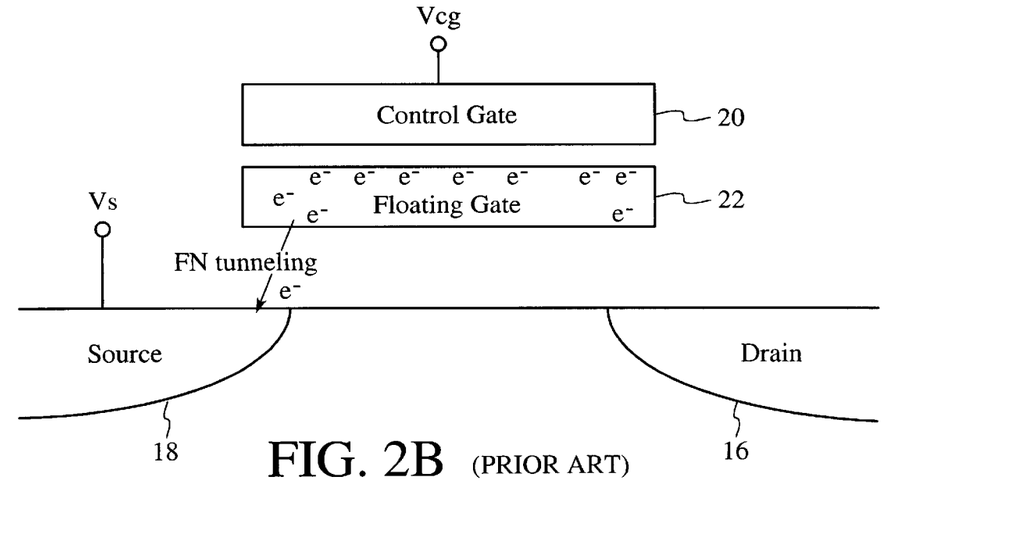

FN tunneling may be used to either remove electrons from the floating gate 22 or place electrons onto it. Appropriate voltages need to be applied to the control gate 20, source 18, drain 16, and the p-type well or substrate. These voltages create an electric field so high that electrons may tunnel between the floating gate 22 and other region such as source 18, drain 16, or channel 26, through a mechanism known as Fowler-Nordheim tunneling. An example is the erase technique commonly used by NOR-type FLASH devices. These devices are programmed (floating gate 22 charged with electrons) using channel hot electron injection. During erasure, as illustrated in FIG. 2(B), a negative voltage (typically −8 to −11 V) is applied to the control gate 20. A positive voltage (typically 4 to 5 V) is applied to the source 18. The high electric field across the tunnel oxide (which is the silicon dioxide layer between the floating gate 22 and channel 26) at the overlap region between the floating gate 22 and the source 18 causes electrons to tunnel from the floating gate 22 into the source 18.

Figure 3A:
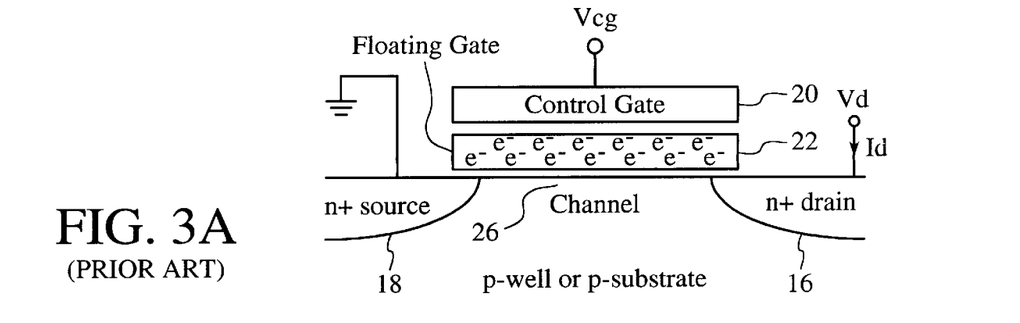
Figure 3B:
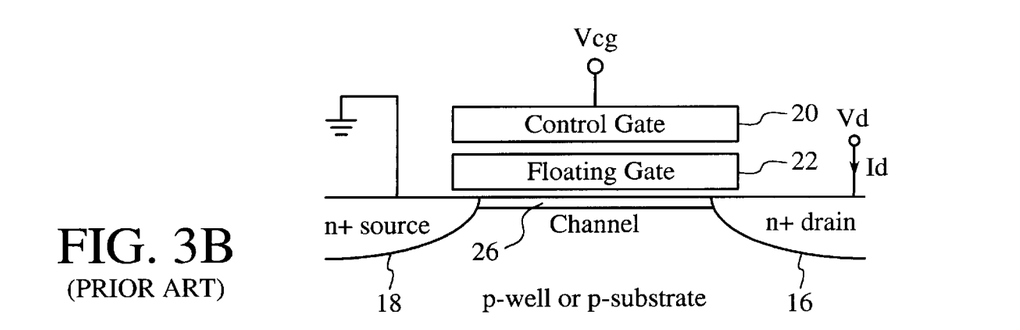

Irrespective of the program and erase mechanism, prior art non-volatile memory cells utilizing a floating gate to store charge are read with the same technique. This technique is depicted in FIG. 3 (A) for a memory cell that has electrons stored on the floating gate, and 3 (B) for a memory cell without electrons. An appropriate voltage (3 to 5 V) is applied to the control gate 20, and a voltage of 1 to 2 V is applied to the drain 16. The source 18 is grounded. For a cell with its floating gate 22 charged with electrons, as illustrated in FIG. 3 (A), the control gate voltage during read operation which is capacitively coupled to the floating gate 22 is not high enough to overcome the negative potential brought about by the electrons stored on the floating gate 22. The channel 26 is therefore not inverted. Such a cell is in an "off" state. The electron current that flows from source 18 to drain 16 is very low (typically in the nA current range). For a cell with its floating gate 22 depleted of electrons or even occupied by holes, as illustrated in FIG. 3 (B), the control gate 20 voltage of 3 to 5 V is high enough to invert the cell channel 26. A high electron current (tens to hundreds of uA in current) flows from source 18 to drain 16. The sense amplifier measures the cell current and compares such current with a reference current which is usually greater than the off-state cell current and lower than the on-state cell current. The logic state stored in the memory cell is determined by whether the cell current is higher or lower than this reference current.

Definition of the logic state (0 or 1) may vary, as "1" is used to denote the state when the cell threshold voltage is high (floating gate 22 charged with electrons) by some, and "0" is used to denote such a state by others. This document adopts the former definition. Translation from one definition into the other is straightforward for one of ordinary skill in the art.

Since the floating gate 22 is encapsulated by insulating materials, the charge placed on the floating gate 22 (and therefore the logic state stored in the cell) may be maintained for an extended period even after power is turned off from the system.

Figure 4:
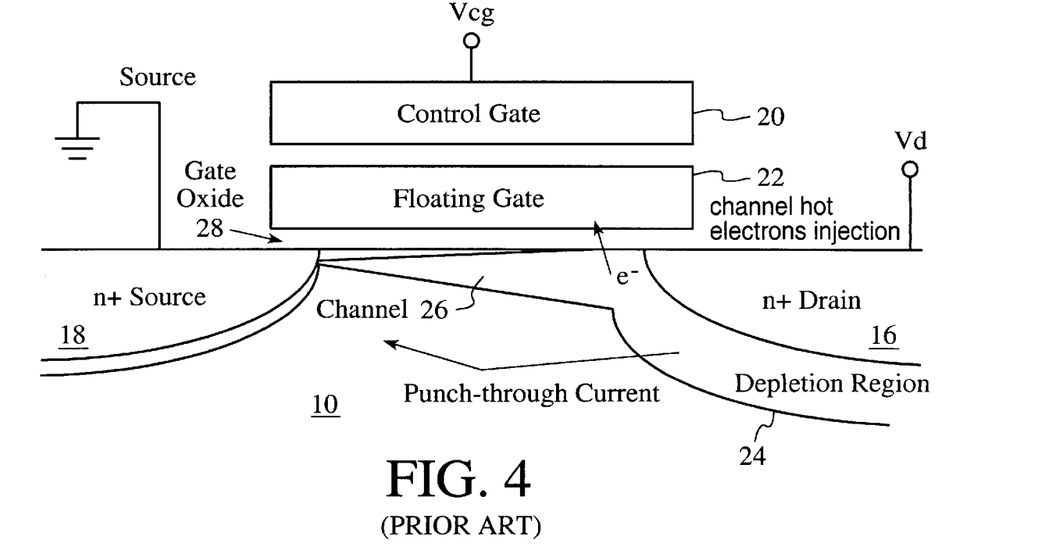
FIG. 4 is a schematic illustrating short-channel effects during read operation. Junction curvature near the drain causes high electric field which leads to hot electrons injection. Also shown is punch-through leakage. Off-state (or subthreshold) leakage is not shown.

The major challenge in shrinking the cell size is the scalability of the cell transistor. As the channel length of the cell transistor scales down, short-channel effects such as hot-carrier injection during read operation, channel punch-through, and off-state leakage current become serious technology barriers. (These phenomena are similar to those occurring in regular MOS transistors when the channel length is scaled down.) FIG. 4 illustrates these adverse effects. During read operation, the channel current generates hot carriers that may be injected into the floating gate 22 or trapped in the gate oxide 28 through a process similar to hot electron programming. Albeit occurring at a much lower rate than during hot electron programming, this phenomenon will introduce unintentional programming of the cell and impose long-term reliability concerns. For example, a cell with a low threshold voltage may have its floating gate 22 slowly charged up by injected hot electrons during read operation to a point where the threshold is high enough to cause read error (mistakenly identified by the sense-amplifier as in a high-threshold state).

Off-state leakage current caused by channel punch-through or gate-induced drain leakage may also lead to read errors. This effect is especially serious for FLASH cells with short channel length. A cell in a high threshold state should not conduct much current during read operation. If the drain 16 to source 18 leakage current is too high for a cell in a high threshold state, the leakage current may fool the sensing circuit into believing that the cell is actually in a low threshold state. These are all major concerns which will ultimately limit how small a FLASH memory cell can be made. The present invention addresses these needs.

SUMMARY OF THE INVENTION

The present invention is directed toward a novel type of FLASH EEPROM cell that is highly scalable in size, easy to fabricate, reliable and capable of in-system programmability. The semiconductor memory cell comprises a lightly doped n- region including a channel region, a first insulating layer overlying portions of said n- region, and a floating gate overlying said first insulating layer. The cell further includes a second insulating layer overlying said floating gate and a control gate overlying second insulating layer. To more particularly describe the features and advantages of the present invention, refer to the following discussion in conjunction with the accompanying figures.

BRIEF DESCRIPTION OF THE DRAWINGS

FIG. 1 (A) is a cross-sectional schematic of a prior art ETOX cell where the cell is placed in the p-substrate.

FIG. 1 (B) is a cross-sectional schematic of a prior art ETOX cell where the cell is placed in a p-well inside the p-substrate.

FIG. 1 (C) is a cross-sectional schematic of a prior art ETOX cell where the cell is placed in a p-well inside an n-well. The n-well itself is in the p-substrate.

FIG. 2 (A) is a diagram illustrating hot electron programming.

FIG. 2 (B) is a diagram illustrating Fowler-Nordheim tunneling erase.

FIG. 3 (A) is a diagram illustrating read operation of a programmed cell. Id in this case is very small because the channel is off.

FIG. 3 (B) is a diagram illustrating read operation of an erased cell. A considerable current Id would be detected even at modest Vd (1 to 2 V) because the channel has been turned on.

FIG. 5 (A) is a cross-sectional schematic (along the bitline) of one implementation of the invented cell.

FIG. 5 (B) is a cross-sectional schematic (along the wordline) of one implementation of the invented cell.

FIG. 5 (C) is a diagram illustrating a different implementation of cell 100 where a p-region formed by boron implant underlies the shallow n- region to contain the n- region.

FIG. 5 (D) is a diagram illustrating an implementation of cell 100 with the conventional source/drain implant.

FIG. 5 (E) is a diagram illustrating an implementation of cell 100 using SOI technology.

FIG. 5 (F) is a diagram illustrating an implementation of cell 100 using SALICIDE technology.

FIG. 5 (G) is a diagram illustrating an implementation using quantum-well.

FIG. 8 (A) is a diagram illustrating read operation of a selected cell.

FIG. 8 (B) is a diagram illustrating read operation of a programmed cell using the current sensing scheme. For easy illustration, only a single cell is shown.

FIG. 8 (C) is a diagram illustrating read operation of an erased cell.

DETAILED DESCRIPTION

The present invention relates to an improvement in a FLASH EEPROM cell. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiment. Thus, the present invention is not intended to be limited to the embodiment shown but is to be accorded the widest scope consistent with the principles and features described herein.

For this disclosure, the invention is discussed in the context of NAND architecture. Extension of this disclosure into NOR architecture should also be applicable, and is straightforward for those skilled in the art.

The present invention comprises a new cell structure and new methods to access the logic state stored in such cells. The present invention solves the challenges in scaling conventional FLASH cell transistors. The cell features a stacked-gate structure similar to those commonly used in the prior art NOR and NAND FLASH technologies, as shown in FIG. 5 (A) through (G). But instead of having a lightly doped p-type channel region (26 in FIG. 1) as in prior art, this cell features a shallow, lightly doped n-type channel 112. The doping concentration of this lightly doped n-type channel is in the range of $10^{12}$ to $10^{14}$ cm$^{-2}$. The drain 16 (n-type) to channel 26 (p-type) np junction in prior art (FIG. 1) is eliminated as a consequence.

Figure 8A:
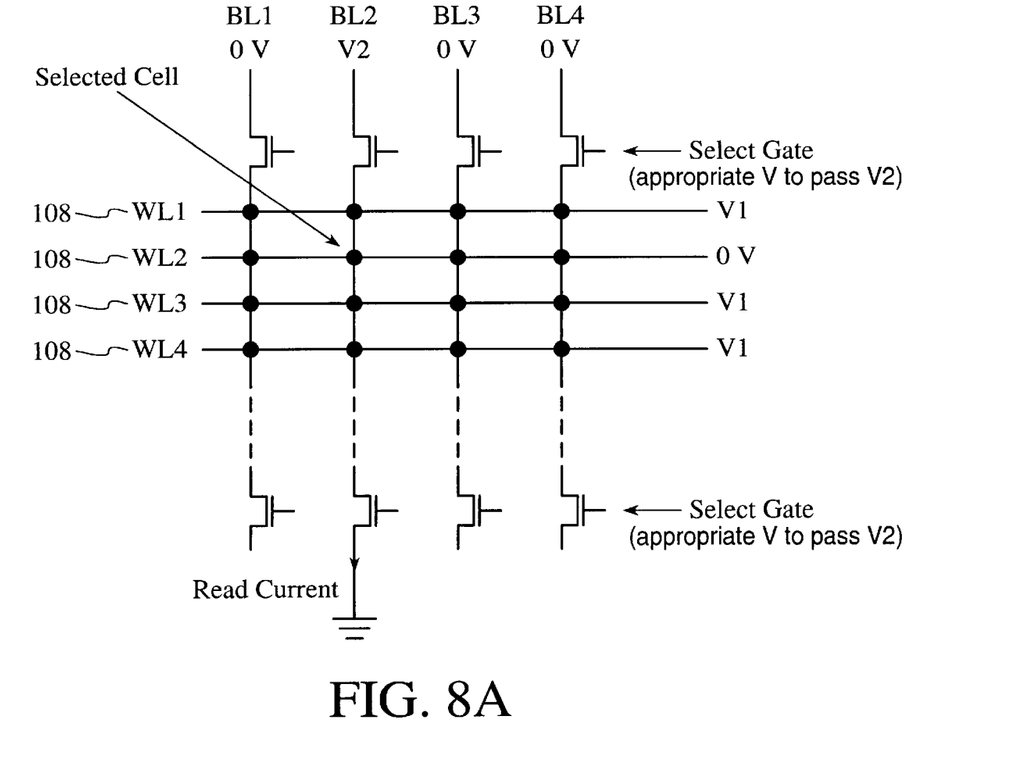
Figure 8B:
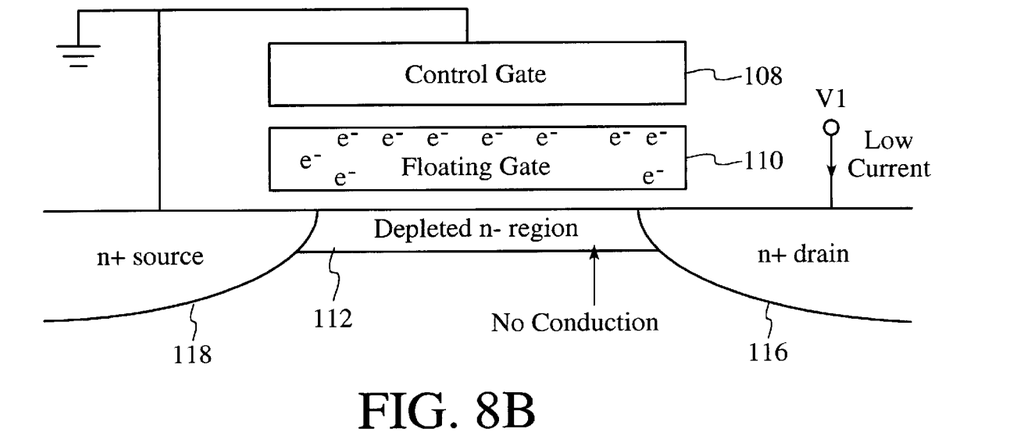
Figure 8C:
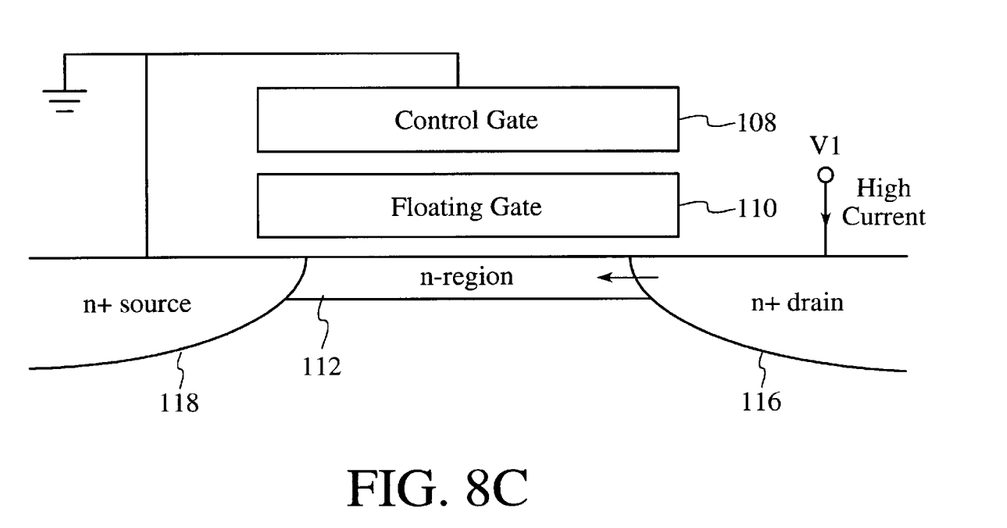

Program and erase of cell 100 may both be carried out using FN tunneling as in prior art. Reading of cell 100 is accomplished through the technique illustrated in FIG. 8 (B) and (C). The logic state that is stored in the cell is determined by whether a current may flow through the shallow, lightly n-type doped channel 112 under appropriate voltages applied to the control gate 108 and drain 116, with its source 118 grounded. For a floating gate 110 depleted of electrons or even storing holes (FIG. 8 (C)), a grounded control gate 108 would force the n-type channel 112 into either a neutral state or accumulation. That is, the channel surface would be filled with the majority carriers (electrons). Current may flow between the drain and source under a moderate (0.5 to 2 V) drain voltage. On the other hand, if the floating gate 110 stores electrons (FIG. 8 (B)), the net potential on the floating gate is negative if the control gate 108 is grounded. The negative potential on the floating gate would deplete the shallow n-type channel and stop the channel current even if the drain voltage is present. Similar to prior art, the sense amplifier compares the cell current with an appropriately chosen reference current which should be higher than the off state cell current but lower than the on state cell current. The logic state stored in the cell is thus determined by whether the cell current during read operation is higher or lower than this reference current.

Contrary to prior art, the channel between the drain 116 and source 118 is now n-type in this invention, eliminating the depletion region 24 in FIG. 4 which is caused by the reverse bias between the n-type drain (16 in FIG. 4) and the p-type channel 26. By eliminating the depletion region, hot electron injection during read operation will be dramatically reduced.

Cell Structure:

A cross-section of one implementation of the cell 100 in its preferred embodiment along the bitline of the cell and along the wordline of the cell is depicted in FIG. 5 (A) and (B) respectively. Comparing FIG. 1 (conventional ETOX cell 10) with FIG. 5 (this invention disclosure), it is clear that the disclosed cell is similar to the prior art ETOX cell in that it uses a double-gate structure commonly fabricated using a self-aligned poly-silicon etch process, even though other fabrication techniques are not excluded. A thin layer of good insulator, preferably a composite oxide-nitride-oxide layer 102, is placed between the control and floating gates 108 and 110. This interpoly dielectric layer 102 helps to couple the voltage applied to the control gate 108 onto the floating gate 110, and to retain electrons or holes stored on the floating gate 110 by insulating the floating gate 110 from the control gate 108. The distinct feature of this invention is the lightly doped n- region 112 including the channel region. (The designation of n- region is used to denote lightly doped n type region, whereas the designation of n+ region is used to denote highly doped n type region.)

Figure 6:
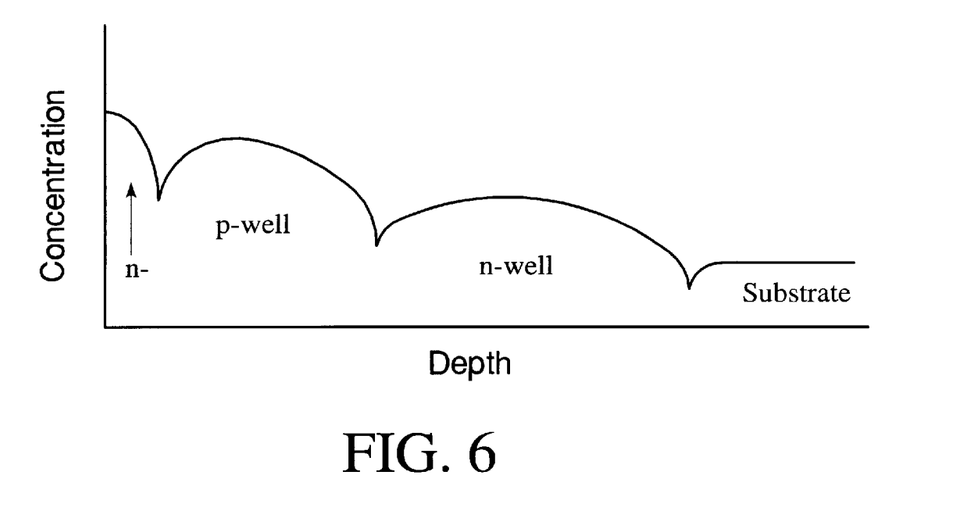
FIG. 6 is a diagram of a typical channel doping profile of cell 100.

In the extreme embodiment, the shallow n- region will approach that of a sheet charge at oxide-silicon interface. The n- region can be kept at extreme shallow depth into the silicon through antimony implant which is known not to diffuse much into silicon. In one preferred embodiment, the implant dose used to form the lightly doped n- region should be in the range of $10^{12}$ to $10^{14}$ $cm^{-2}$ to allow the gate potential to fully modulate the conductivity of the region. FIG. 6 shows a typical doping profile in the channel for this disclosure. The n- region can be kept within 500 to 1500 angstroms of the oxide-silicon interface.

The shallow n- region 112 in FIG. 5 (A) is contained by a p-well 122. Such p-well is commonly used in prior art to prevent punch-through from drain to source. In this invention, however, the p-well is used to contain the shallow n- region. The p-well may be formed by ion-implant followed by thermal drive-in as in prior art. An additional high-energy boron implant may be used to further contain the n- region 112, as shown in FIG. 5 (C). This additional implant would effectively create a retrograde p-type region with only a shallow n- region at the surface.

Underneath the p-well 122, an n-well 124 may be needed, as shown in FIG. 5 (A). This n-well is also commonly used in prior art to isolate the cells from periphery circuits. This is especially important when positive voltage is applied to the p-well for bulk or sector erase. In such conditions the cell area has to be isolated from the periphery, otherwise the positive voltage would forward bias the p-substrate to n+ junctions in the periphery and disrupts functionality of NMOS transistors in the periphery. Again the n-well may be formed using ion-implantation and diffusion to drive in the dopant, as is routinely done in prior art. If erase is done with only negative voltage on the control gate 108 without the positive p-well bias, then it would not be necessary to have p-well isolated from p-substrate with an n-well. The p-well can just be part of the doping profile of the p-substrate.

A comparison between FIG. 1 and 5 (A) reveals that the disclosed cell does not mandate separate implementation for source or drain. However, the conventional source/drain implant may still be used and would reduce the bitline resistance. An implementation of cell 100 with the source/drain implant is illustrated in FIG. 5 (D). This cell may also be implemented using SOI (silicon-on-insulator) technology, where the p-well 122 in FIG. 5 (A) now resides on an insulating substrate instead of the p-type Si substrate, as shown in FIG. 5 (E).

Figure 5A:
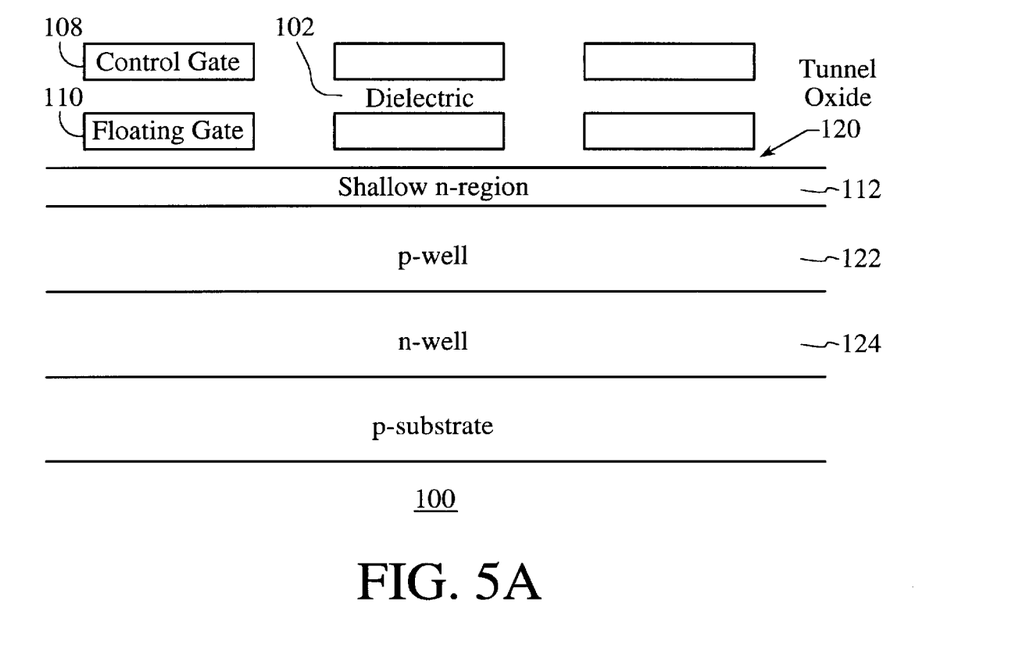
Figure 5B:
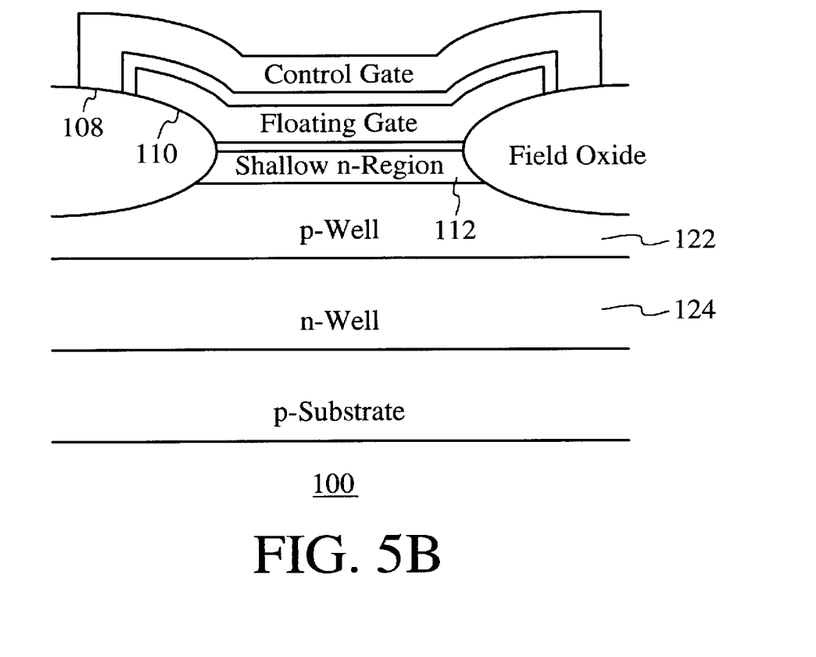
Figure 5C:
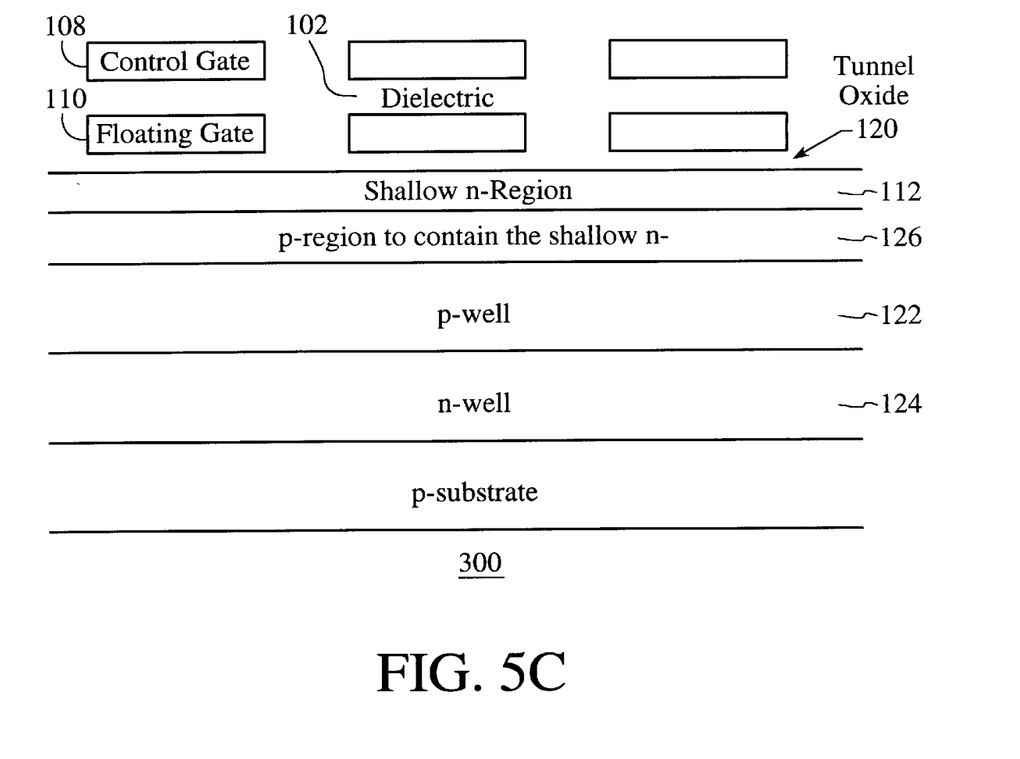
Figure 5D:
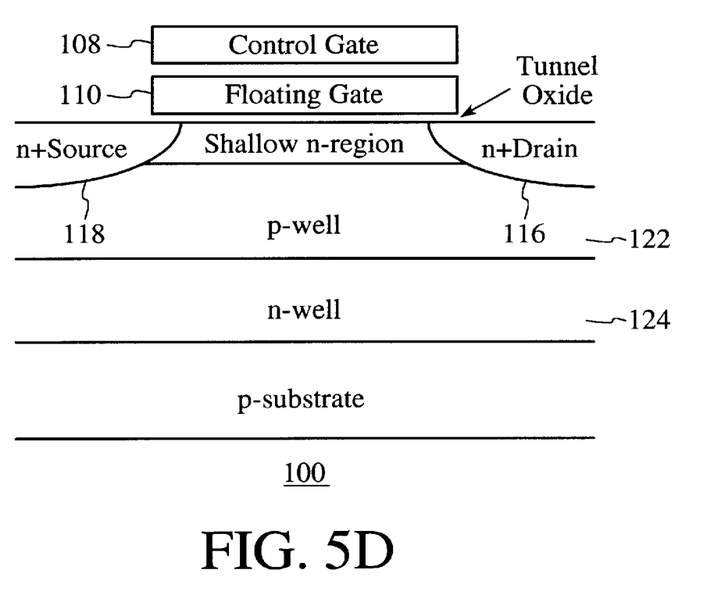
Figure 5E:
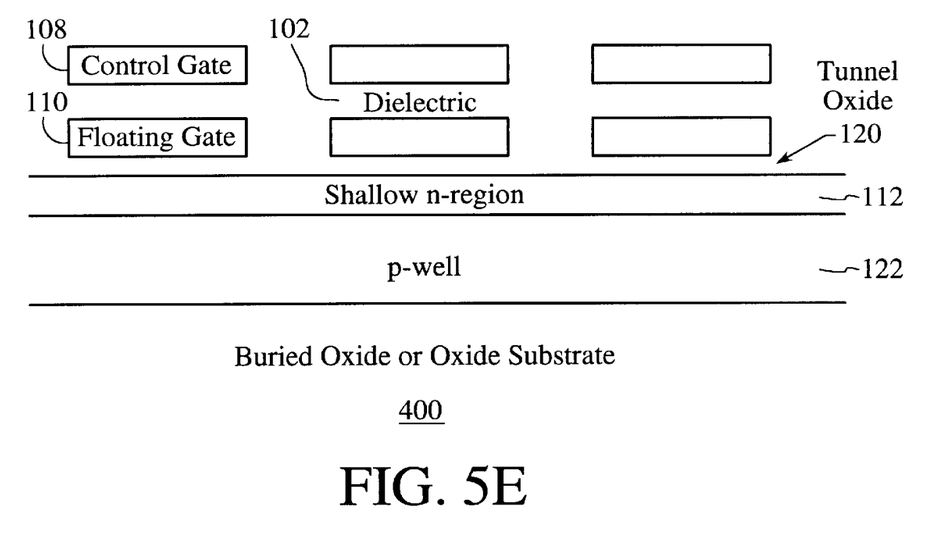
Figure 5F:
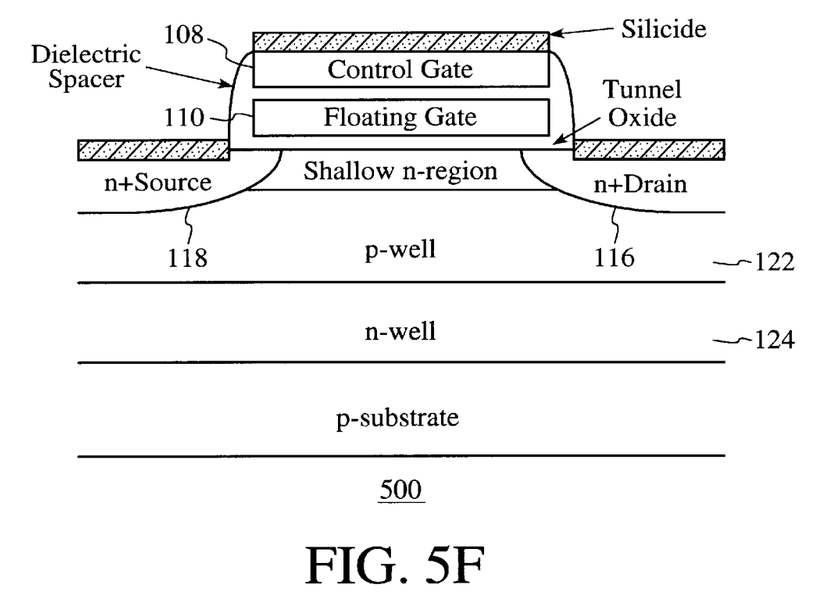

Should self-aligned silicidation (SALICIDE) be used, the resistance of the bitline and wordline may both be reduced further. SALICIDE is commonly used in circuits where low gate and source/drain resistance are required to reduce RC delay and thus increase circuit speed. In such processes, the gate and source/drain are first formed but isolated from each other by a dielectric spacer. Metal such as Ti and Co is deposited on the substrate, in direct contact with Si in the gate, source, and drain region. With thermal annealing, the metal forms metal silicide on the gate, source and drain. After metal that does not react with exposed Si is removed, normally through selective chemical etching, the gate, source and drain silicide are simultaneously formed without any masking step, thus named self-aligned silicide. The invented cell implemented with SALICIDE is shown in FIG. 5 (F).

Figure 5G:
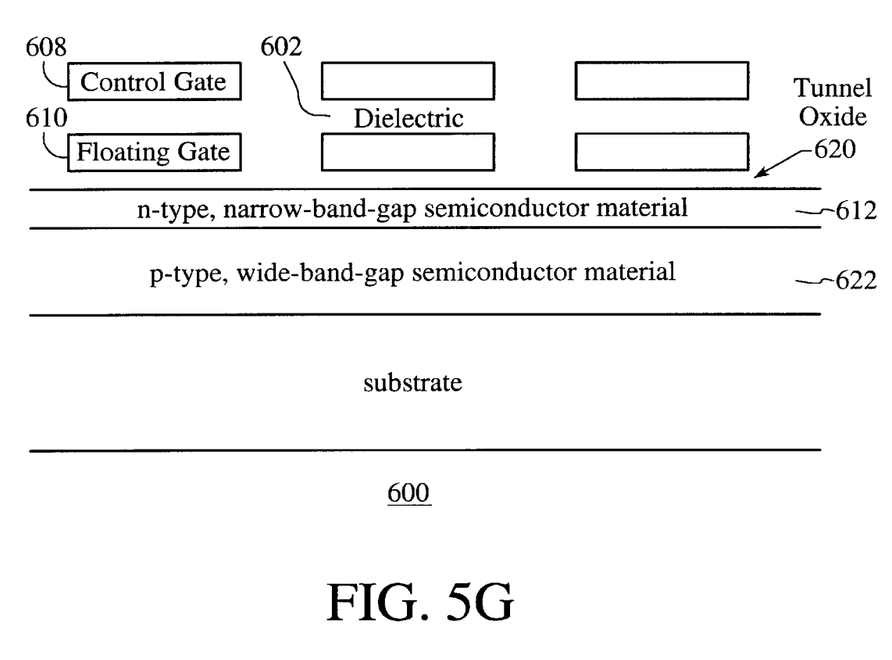

A hetero-junction structure can also be used to create a "quantum well" of n- region. This can be achieved by using different semiconductor material layers with different band-gap energy for the lightly doped n- region and the p-well. For one skilled in the art, this forms a "quantum well" which can be used to confine the n- region close to the surface. The key of this approach is to confine the n- region, which is used for channel conduction, close to the surface so that gate potential can fully modulate the conductivity of this n- region. The cross-sectional schematic of an example of such a cell is shown in FIG. 5 (G), where layer 622 consisting of a p-type wide-band-gap semiconductor material confines electrons within the shallow layer 612 consisting of an n-type narrow-band-gap semiconductor material.

As discussed earlier and illustrated in FIG. 5 (D), cell 100 may be implemented with source/drain implant. It should be obvious to one of ordinary skill in the art that cell 300, 400, 500, and 600 may also be implemented with such an implant.

Program/Erase Algorithm:

The disclosed cell is both programmed and erased using FN-tunneling, in a fashion similar to that used by the conventional NAND architecture. Program and erase may be understood by examining the array architecture (FIG. 7), in this example configured in a NAND fashion.

Figure 7:
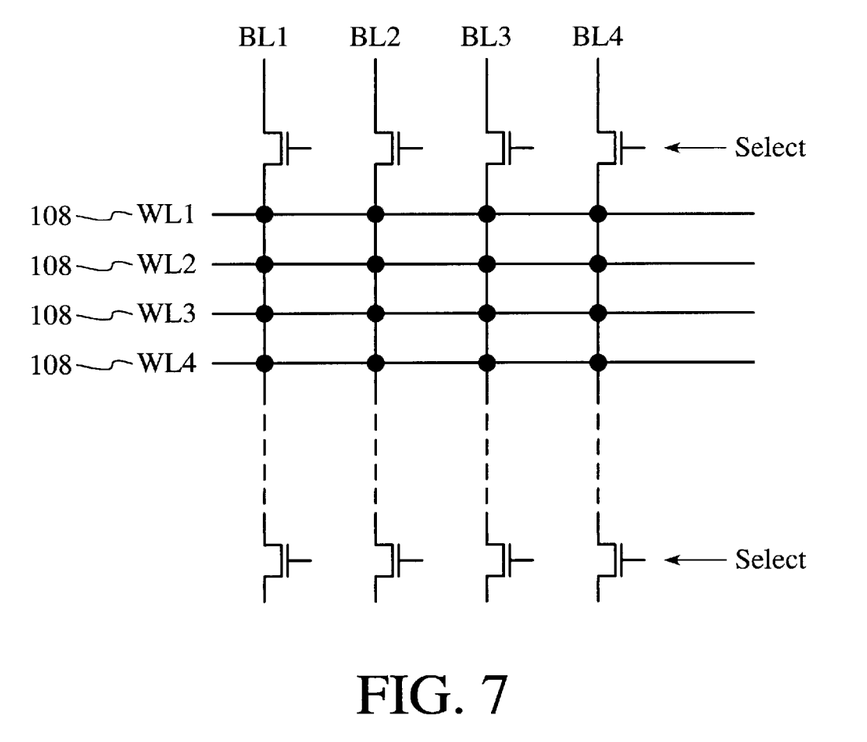
FIG. 7 is a diagram of an array architecture.

Assuming the cell at the intersection of WL2 and BL2 is the "selected" cell, i.e., the cell to be programmed. The program condition is summarized in the following table:

| WL1, WL3, . . . (unselected wordlines) | WL2 (selected wordline) | BL1, BL3, . . . (unselected bitlines) | BL2 (selected bitline) |
|---|---|---|---|
| intermediate voltage to pass the bitline voltage but not high enough to cause programming | Vpp | intermediate voltage to prevent programming unselected cells | ground |

In the above scheme, programming is achieved by applying Vpp (programming voltage) to the selected wordline (the control gate 108). Vpp is chosen to cause electrons to tunnel from the shallow n- channel 112 (refer to FIG. 5) which is grounded for the selected bitline, into the floating gate 110, through the thin tunnel oxide. A typical Vpp value might be 14 to 18 V. Unselected wordlines are used to pass the bitline voltage, but not high enough to cause programming of unselected bits. Typical bias for unselected wordlines is 8 to 10 V. A selected bitline will be biased at ground so as to have the highest possible voltage across the tunnel oxide to facilitate programming. Unselected bitlines will be biased at Vcc to force channel of unselected bits to have an appropriate potential. This channel potential is used to reduce the electric field across the tunnel oxide, in order to inhibit programming of unselected bits. The exact values of Vpp and voltage values to bias unselected bitlines and wordlines may be easily determined by those skilled in the art, using thickness of the tunnel oxide, the actual cell layout (which affects the gate coupling coefficient), and the thickness and effective dielectric constant of the interpoly dielectric.

It is during this operation, when unselected bitlines are biased at an intermediate voltage, that the absence of abrupt junction in this invention helps to minimize undesirable reliability concerns due to high junction field, as in prior art. Another common problem that occurs in NAND for prior art is that of field isolation induced program disturb. Finite junction in prior art can cause leakage in field isolation area and lead to program disturb problems. For the invented cell, if implemented without separate source/drain implant (such as cell 100 in FIG. 5 (A), cell 300 in FIG. 5 (C), and cell 400 in FIG. 5 (E)), this problem is minimized due to absence of deep source/drain junctions.

Bulk erase, typically used by FLASH technologies, is adopted. A high voltage is applied to the p-well (122 in FIG. 5) (inside the n-well 124 in a triple-well configuration) with all wordlines grounded. The voltage difference between the floating gate 110 and the channel 112 causes electrons in programmed floating gates to tunnel back into the channel. Erasure may also be implemented with a negative voltage applied to all wordlines to decrease the positive bias on the p-well. Please note that since during erasure a voltage drop is developed across the n- region due to depletion of this region, the erase voltage will be 1 to 2 V higher than if the channel is in accumulation as in most prior art, in order to overcome the voltage drop across the depletion region at the channel surface.

Read Algorithms:

For a programmed cell, electrons are stored in the floating gate 110. An erased cell, on the other hand, has a floating gate 110 in charge-neutral state, i.e., without excess electrons. It may even be over-erased and carry some positive charge. Read operation of the cell is carried out by applying appropriate bias to various wordlines and bitlines, as shown in FIG. 8 (A). Again the cell at the intersection of WL2 and BL2 is the selected cell:

| WL1, WL3, . . . (unselected wordlines) | WL2 (selected wordline) | BL1, BL3, . . . (unselected bitlines) | BL2 (selected bitline) |
| --- | --- | --- | --- |
| V1 | ground | ground | V2 |

Here VI is chosen to drive the channel of unselected cells (either in programmed or erased state) into accumulation. The unselected cells therefore act as conductors. For the selected cell, if it is in the programmed state, the negative potential on the floating gate 110 would fully deplete the shallow n- channel 112 with a 0 V on the control gate. Here the n- channel 112 has to be shallow enough to allow complete depletion by a programmed cell when the wordline is biased at 0 V. As mentioned before, an example of the n- implementation is to use shallow antimony implant into the channel. The n- region will then be confined at the surface to facilitate depletion for a programmed cell. The cross-sectional schematic of an erased and a programmed cell under read operation is illustrated in FIGS. 8 (B) and (C), respectively. Please note that in FIG. 8 (B) and 8 (C) the actual source and drain junctions are illustrated to demonstrate more clearly the read operation. All preferred embodiments of the invented cell (shown in FIG. 5 (A) through (G)) may also be read with the same technique.

The bias V2 is applied to one end of the selected bitline (BL2). An appropriate current-sensing circuit may be used on the other end of BL2 to detect current. If the selected bit is programmed, the depleted channel would stop current conduction through the n- channel 112. An erased cell on the other hand would lead to either a neutral state or accumulation in the channel. A current will flow from V2 into the current sensing circuitry. The state of the selected cell would then be determined using the sense amplifier by comparing the cell current with the reference current, which lies between the on-state and off-state cell read current.

A potential drawback of this approach is the long cell access time which translates into low system speed, caused by the high channel resistance inevitable of a shallow n-channel. This would not be a concern for massive-storage applications at which this invention is targeted, since the serial access mode typically adopted by such devices does not require high speed.

ADVANTAGES OF INVENTION

The disclosed invention uses a novel memory cell to implement FLASH EEPROM. It has the following advantages over prior arts:

1. Cell size is highly scalable. It is not susceptible to short-channel effects plaguing all prior arts. Such technology is most suitable for mass-storage applications, where the storage capacity per chip can be greatly increased by this invention, compared with existing FLASH devices fabricated with technologies of similar complexity. Its potential for embedded applications is also unlimited.

2. Easy implementation. The double-poly gate structure is similar to an ETOX cell. The channel area does not require any threshold-adjust implant nor any drain engineering as required by all prior arts. No special fabrication technique is needed except possibly a shallow n- channel junction formation.

3. Reliable cell operation. The disclosed cell is not susceptible to hot-carrier effects which is especially pronounced in sub-micron transistors. Such effect usually is designed out by careful drain engineering and using conservative read bias conditions which often mandate low cell read current and reduced circuit performance.

4. Proven program/erase algorithm. As discussed earlier, the program/erasure algorithm is similar to that used by the conventional NAND configuration. Its effectiveness has long been proven.

Due to the potentially low cost/MByte offered by the scalability and technology simplicity of this invention, it would become a strong candidate for replacing magnetic hard-disks as the future computer mass-storage medium.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

We claim:

1. A semiconductor memory cell comprising:
   a continuous n-channel region including a channel region;
   a first insulating layer overlying said continuous n-channel region wherein a neutral state of the n-channel region is active;
   a floating gate overlying said first insulating layer;

a second insulating layer overlying said floating gate; and a control gate overlying said second insulating layer.

2. The cell in claim 1 wherein the continuous n- region is confined and has a dose in the range of $1\times10^{12}$ cm−2 to $1\times10^{14}$ cm−2 such that the gate potential can fully modulate the conductivity of the n- region.

3. The cell in claim 1 further comprising a p-type well inside an n-type well.

4. The cell of claim 1 further comprising a p-type well inside a p-substrate.

5. The cell of claim 1 wherein the continuous n-channel region is implemented with a shallow n-implant.

6. The cell of claim 5 wherein the continuous n-region is further implemented with antimony implant.

7. The cell of claim 1 wherein the continuous n-channel region is implemented with semiconductor material with different bandgap to obtain a heterojunction structure with quantum well.

8. The cell of claim 1 wherein the continuous n-channel region is in the range of 500 Angstroms to 1500 Angstroms in thickness.

9. The cell of claim 1 further comprises an additional p-type high energy implant to further limit the continuous n-channel region to shallow junction depth.

10. The cell of claim 1 further comprises providing salicidation to the continuous n-channel region not underlying the gate to reduce series resistance.

11. The cell of claim 1 further comprises providing additional n-type implant to said continuous n-channel region not underlying the gate to further reduce source and drain resistance.

12. The cell of claim 1 wherein the continuous n-channel region overlying an insulator for SOI implementation.

13. A method of programming a Flash memory cell having a continuous n- region, said method comprising the steps of:

applying a first bias voltage to a control gate of said cell;

biasing unselected wordlines at a second bias voltage;

biasing unselected bitlines at a third bias voltage; and biasing a selected bitline at a ground potential, wherein a neutral state of the n-channel is active.

14. A method of erasing a Flash memory cell having a continuous n-channel region, comprising the steps of:

applying a first positive bias voltage to P-well or P-substrate of said cell; and applying a second bias voltage to a control gate of said cell wherein the second bias voltage is 0 V or negative voltage, wherein a neutral state of the n-channel region is active.

15. A method of reading/sensing a FLASH memory cell having a continuous n-channel region, comprising the steps of:

biasing unselected wordlines at a first bias voltage;

biasing a selected wordline at a ground potential;

biasing unselected bitlines at a ground potential;

applying a second bias voltage to a bitline of selected said cell;

reading (sensing) the cell current from the bitline of the selected said cell; wherein from the said cell current the stored logic state on the floating gate of the said cell may be determined, wherein a neutral state of the n-channel region is active.

* * * * *